(12) United States Patent
Fukui et al.

(10) Patent No.: US 7,736,613 B2
(45) Date of Patent: Jun. 15, 2010

(54) MODIFICATION PROCESS OF SYNTHETIC SILICA POWDER AND ITS QUARTZ GLASS PRODUCT

(75) Inventors: Masanori Fukui, Akita (JP); Takahiro Satoh, Akita (JP)

(73) Assignee: Japan Super Quartz Corporation, Tokyo (JP)

( * ) Notice: Subject to any disclaimer, the term of this patent is extended or adjusted under 35 U.S.C. 154(b) by 600 days.

(21) Appl. No.: 10/303,899

(22) Filed: Nov. 26, 2002

(65) Prior Publication Data

US 2003/0124044 A1 Jul. 3, 2003

(30) Foreign Application Priority Data

Nov. 26, 2001 (JP) .............................. 2001-358746

(51) Int. Cl.
*C01B 33/12* (2006.01)
*C01B 33/18* (2006.01)
*C03B 19/10* (2006.01)

(52) U.S. Cl. .................. 423/338; 423/335; 502/12; 502/54; 502/133; 502/154

(58) Field of Classification Search ................ 423/335, 423/338; 501/12, 54; 502/12, 54, 133, 154
See application file for complete search history.

(56) References Cited

U.S. PATENT DOCUMENTS

| | | | | |
|---|---|---|---|---|
| 4,072,489 A | * | 2/1978 | Loxley et al. ............... | 65/17.3 |
| 4,317,668 A | * | 3/1982 | Susa et al. .................. | 65/17.2 |
| 4,956,208 A | | 9/1990 | Uchikawa et al. | |
| 4,979,973 A | * | 12/1990 | Takita et al. ................ | 65/17.6 |
| 5,185,020 A | * | 2/1993 | Satoh et al. ................. | 65/404 |
| 6,849,242 B1 | * | 2/2005 | Koeppler et al. ........... | 423/338 |
| 2002/0115757 A1 | * | 8/2002 | Murschall et al. .......... | 524/104 |
| 2002/0166341 A1 | | 11/2002 | Shelley et al. | |
| 2003/0125187 A1 | * | 7/2003 | Akimoto et al. ............. | 501/54 |

FOREIGN PATENT DOCUMENTS

| | | |
|---|---|---|
| DE | 195 41 372 A1 | 5/1996 |
| EP | 0 530 825 A1 | 3/1993 |
| EP | 1 167 309 A1 | 1/2002 |
| JP | 1-148782 | 6/1989 |
| JP | 03-086249 | 4/1991 |
| JP | 07-172978 | 7/1995 |
| JP | 2530225 | 6/1996 |
| JP | 09-086916 | 3/1997 |
| JP | 10-287416 | 10/1998 |
| JP | 11-049597 | 2/1999 |
| JP | 2001-261353 | 9/2001 |

OTHER PUBLICATIONS

Webster's II, New Riverside University Dictionary, 1984 (no month), p. 376.*

* cited by examiner

*Primary Examiner*—Ngoc-Yen M Nguyen
(74) *Attorney, Agent, or Firm*—Oblon, Spivak, McClelland, Maier & Neustadt, L.L.P.

(57) ABSTRACT

A modified synthetic silica powder is produced by heating in vacuum an amorphous synthetic silica powder produced by a sol-gel process, and then cooling the heated silica powder in an atmosphere containing helium. When the modified synthetic silica powder is fused and vitrified in a process of crucible production, the resulting quartz glass crucible contains hardly any bubbles.

6 Claims, No Drawings

MODIFICATION PROCESS OF SYNTHETIC SILICA POWDER AND ITS QUARTZ GLASS PRODUCT

BACKGROUND OF THE INVENTION

1. Field of the Invention

The present invention relates to a process for modifying synthetic silica powder so that, when the modified powder is fused and vitrified at high temperatures to form a quartz glass product, the quartz glass product will have reduced amounts of carbon and hydroxyl groups and fewer bubbles. The present invention also relates to quartz glass products made using the modified synthetic silica powder.

2. Discussion of the Background

Synthetic silica powder can be produced by a sol-gel method by drying and baking a gel produced by hydrolyzing a metal alkoxide. The resulting synthetic silica powder is amorphous and of high purity with few metal impurities than natural quartz powder. However, this synthetic silica powder is known to contain residual carbon and hydroxyl groups from the alkoxide. When a quartz glass crucible is produced from synthetic silica powder made by the sol-gel method, the residual carbon and hydroxyl groups can cause unwanted bubbles to form in the quartz glass.

Many attempts have been made to reduce the residual carbon in the synthetic silica powder produced by the sol-gel method. For example, Japanese Laid Open Patent Nos. H09-86916 and No. H10-287416 disclose a process in which the dried gel powder is heated to remove residual carbon by burning at a temperature of less than 600° C., where the pores in the powder are not closed, and then, after the decarbonization, baking and vitrifying the powder at a temperature of from 1000° C. to 1300° C., where the pores in the powder are closed, to produce amorphous synthetic silica powder. A process is known in which silica powder produced by the sol-gel method is heated at about 500° C. in air to burn organic components, and then is vitrified by heating to a higher temperature to remove the OH groups. Japanese Patent Registration No. 2530225 discloses a process in which the dried gel powder is baked in two steps in a dry atmosphere or a vacuum at the time of making the synthetic silica powder to produce synthetic silica powder having a predetermined high density. However, it is extremely difficult using these conventional processes to reduce to a large extent the residual carbon in the synthetic silica powder. As a result, it is very difficult to produce the quartz glass products having few inner bubbles.

On the other hand, Japanese Patent Laid Open No. 2001-261858 discloses a quartz crucible produced by a process in which quartz powder produced by the sol-gel method is heated in a hydrogen atmosphere at a temperature of from 800° C. to 1300° C. until the quartz powder no longer exhibits a spectral peak indicating O=C=O bonding. However, the hydrogen reacts with hydroxyl groups in the quartz powder to produce adsorbed water that forms inner bubbles when the powder is vitrified. Moreover, the process is dangerous because the hydrogen gas is introduced at the high temperatures. Furthermore, Japanese Patent Laid Open No. 2001-89168 discloses heating fumed-silica produced by the sol-gel method, and then baking the fumed-silica at high temperatures in a vacuum, a hydrogen atmosphere or a helium atmosphere to make quartz glass powder.

Although all of these conventional processes are aimed at modifying quartz powder by removing residual carbon, the cause of the bubbles created when the quartz powder is vitrified is not limited to the residual carbon. The air components adsorbed on the quartz powder after the heat treatments also become an important cause of the inner bubbles.

SUMMARY OF THE INVENTION

The present invention permits quartz glass crucibles to be formed, with substantially no bubbles, using synthetic silica powder modified by first heating the powder and then preventing the adsorption of air components on the heated powder. The present invention solves the various problems discussed above that are associated with conventional quartz powder modification processes.

More specifically, the present invention provides a powder modification process in which synthetic silica powder is heated to high temperatures in vacuum, to remove gas components contained in the powder, and then treated in a helium atmosphere to prevent the adsorption by the heated powder of air components. Fusing the modified quartz powder results in quartz glass with very few bubbles.

In embodiments, the present invention relates to the following modification process of the synthetic quartz powder.

(1) A modification process of a synthetic silica powder, the process comprising, keeping an amorphous synthetic silica powder made by a sol-gel method in a helium atmosphere at least during a cooling process following a heat treatment carried out in a vacuum furnace at more than a degas temperature and less than a sintering temperature.

In other embodiments, the modification process of the present invention also includes the following modification processes.

(2) A modification process, wherein the highest temperature in the helium atmosphere is from more than 700° C. to less than 1400° C., and the powder is cooled in the helium atmosphere until the powder is at a temperature less than 400° C.

(3) A modification process comprising introducing helium gas having a dew point of less than −50° C. to the inside of the furnace, and cooling the inside of the furnace with the helium atmosphere.

(4) A modification process comprising evacuating the inside of the furnace to a pressure of less than 5 Pa, and introducing the helium gas at least during the cooling process after the heat treatment is carried out at the temperature in the above-mentioned range.

(5) A modification process comprising heating the inside of the vacuum furnace where a synthetic silica powder is put in, at the temperature in a range of from 700° C. to 1400° C., preferably from 800° C. to 1.200° C., keeping the temperature in the above-mentioned range until the pressure in the furnace is less than 5 Pa, introducing the helium gas having a dew point of less than −50° C. to the inside of the furnace, cooling to less than 400° C. in the helium atmosphere, and opening the inside of the furnace to air.

In still other embodiments, the present invention relates to the following quartz glass product and the quartz glass crucible.

(6) A quartz glass product produced by using a synthetic silica powder, where the synthetic silica powder has been treated by any one of the above processes (1) to (5).

(7) A quartz glass crucible for pulling up silicon single crystal, where at least a part of an inside surface of the crucible is treated with, as a raw material, a synthetic silica powder made by any one of the above processes (1) to (5), a bubble content ratio at a bottom part of a transparent glass layer having a layer thickness of less than 0.5 mm from the inside surface of the crucible is less than 0.1% before use and less than 5% after use, and a bubble content ratio at a side wall part of the transparent glass layer is less than 0.3% before use and less than 10% after use.

DETAILED DESCRIPTION OF PREFERRED EMBODIMENTS

Regarding the modification process of the present invention, the synthetic silica powder is heated and kept in high vacuum, for example, at a pressure of 5 Pa or less, and at more than the degas temperature of the synthetic silica powder and less than the sintering temperature of the synthetic silica powder, to remove remarkably the residual gas components in the powder. Moreover, by keeping the silica powder in a helium atmosphere, prior to exposing the silica powder to air, the helium gas diffuses to the inner pores and the inside surface of the silica powder to drive out residual gas components. When this modified synthetic silica powder is heated to produce a glass product, the helium gas diffuses out of the quartz glass, resulting in quartz glass containing hardly any bubbles.

A preferred embodiment of the present invention will now be described.

The modification process of the present invention can be used to produce a quartz glass crucible using a modified synthetic silica powder. The modified synthetic silica powder is made by first vacuum heating, at a temperature more than the degas temperature and less than the sintering temperature, an amorphous synthetic silica powder made by the sol-gel method, and then cooling the heated powder in a helium atmosphere.

In the present invention, the synthetic silica powder produced by the sol-gel method can be formed by first hydrolyzing alkoxysilane to form a silica gel powder. The gel is then pulverized and dried to make dried silica gel powder. When the dried silica gel powder is dehydrated by baking at a predetermined temperature, an amorphous synthetic silica powder can be made. The synthetic silica powder can be a synthetic quartz powder.

After the synthetic silica powder produced by the sol-gel method is heated in the vacuum furnace at more than the degas temperature and less than the sintering temperature, the helium gas is introduced to the inside of the furnace at least during cooling to form a helium atmosphere. The heating temperature is more than the degas temperature and less than the sintering temperature. The degas temperature is about 700° C. or more, at which the gas components adsorbed on the synthetic silica powder are desorbed. The powder sintering temperature is about 1400° C. or more, at which the synthetic silica powder is sintered. Therefore, it is preferable that the heating temperature be in a range of from 700° C. to 1400° C., more preferably from 800° C. to 1200° C. Moreover, it is preferable that the synthetic silica powder is kept in this temperature range for a time period of 1 hour or more, preferably from 2 to 24 hours. If the time period is less than 1 hour, the degas treatment may be insufficient.

It is preferable that the above-mentioned heat treatment be carried out in vacuum. When the silica powder is kept in vacuum and in the above-mentioned temperature range, it is possible to remove most of the gas components adsorbed to or intermixed with the silica powder. Specifically, for example, when the silica powder is kept at the above-mentioned high temperature until the pressure is 5 Pa or less, it is possible to reduce the residual carbon to less than 2 ppm and the residual hydroxyl groups to less than 50 ppm.

After the heat treatment, the inside of the furnace can be kept in the helium atmosphere and cooled. If the silica powder that has undergone the degas treatment is exposed to air directly, the gas components in air are adsorbed again to the silica powder, and when the silica powder is fused and vitrified, the adsorbed gas components cause bubbles to form in the resulting quartz glass product. Regarding the modification process of the present invention, the silica powder that has undergone the degas treatment is kept in the helium atmosphere to adsorb the helium gas before the silica powder is exposed to air. When, after the exposure to helium, the silica powder is exposed to air, the gas components in air are hardly adsorbed by the silica powder. Moreover, when the silica powder is heated, fused and vitrified, the adsorbed helium does not remain in the resulting quartz glass as bubbles, because of the helium can easily diffuse out of the glass. By the way, this effect obtained with helium is not obtained with argon or nitrogen.

It is preferable that the synthetic quartz powder inside of the furnace is at a temperature in a range of from 700° C. to 1400° C. when the helium atmosphere is introduced. It is also preferable that the quartz powder remains in the helium atmosphere until the powder is cooled to 400° C. or less. If the heated silica powder in the helium atmosphere is exposed to air while the powder is being cooled from 700° C. to 400° C., only a small amount of helium is adsorbed on the silica powder. When the resulting silica powder is exposed to air, the gas components in air are adsorbed and it is difficult to achieve a reduction in bubbles when the silica powder is vitrified into glass. In order to adsorb helium fully on the silica powder to control the adsorption of the air components, it is preferable that the helium gas is introduced into the inside of the furnace when the silica powder being cooled is at a temperature of 700° C. or more, that is, while or after the heat treatment, and the helium gas is kept in the furnace until the temperature inside the furnace is less than 400° C., and after that, the inside of the furnace is opened to air to take out the silica powder. When the inside of the furnace is kept in the helium atmosphere to less than 400° C., helium is adsorbed fully on the silica powder, so that it is possible to prevent the adsorption of the air components.

It is preferable that the introduced helium gas has the dew point of less than −50° C. If the temperature of the introduced helium gas has the dew point of more than −50° C., small amounts of water existing in the helium gas can be adsorbed on the silica powder, and this water can result in bubbles when the silica powder is vitrified into glass.

As mentioned above, regarding the modification process of the present invention, for example, the temperature inside the vacuum furnace, in which the synthetic silica powder is placed, can be set to from 700° C. to 1400° C., preferably from 800° C. to 1200° C., and the inside of the furnace can be kept in the helium atmosphere at least during cooling from these temperatures. In addition, when the inside of the furnace is heated in vacuum at a pressure of 5 Pa or less, it is preferable that the inside of the furnace be evacuated so that the pressure is 5 Pa or less in the above-mentioned temperature range. After that, the helium gas having the dew point of less than −50° C. can be introduced to the inside of the furnace at the temperature above 700° C., and can be kept in the furnace until the temperature inside the furnace cools to 400° C. or less. Then, the silica powder can be taken out to air. When the helium gas is not introduced to the furnace after the heat treatment in vacuum, preferably the silica powder is taken out of the furnace only after cooling the inside of the furnace to less than 200° C.

As mentioned above, regarding the synthetic silica powder, the degas treatment is carried out by heat treatment at high temperature, and the helium atmosphere is kept to adsorb helium to the silica powder to control the adsorption of the air components. As a result, it is possible to make quartz glass having hardly any bubbles when the silica powder is taken out to air, fused and vitrified. Specifically, it is possible to make a quartz glass crucible for pulling up silicon single crystal, in which the bubble content ratio at the bottom part is less than 0.1% before use and less than 5% after use, and the bubble content ratio at the side wall part is less than 0.3% before use and less than 10% after use.

EXAMPLES

The present invention will be more concretely explained using the following examples and comparison examples.

An amorphous synthetic silica powder made by hydrolyzing alkoxysilane, in which the concentration of the residual carbon was 27.4 ppm and the residual hydroxyl group was 76 ppm, was heated and degassed in vacuum under the conditions shown in Table 1. After that, the degassed powder was cooled in a helium gas atmosphere. The concentrations of the residual carbon and the residual hydroxyl group after the heat treatment in vacuum and the cooling treatment are shown in Table 1. Then, the treated synthetic silica powder was used as a part of the material to produce a quartz glass crucible. Regarding the crucible, the synthetic silica powder shown in Table 1 was used on the inside part of the crucible, in which an inside surface layer having the layer thickness of 2 to 3 mm from the inside surface was made by the synthetic quartz, and the outside surface layer was made by the natural quartz layer having the layer thickness of 10 to 12 mm. The bubble content ratio of the inside surface layer of the quartz glass crucible, in which the layer thickness was 0.5 mm, was measured. In addition, the pulling up of silicon single crystal was carried out by using the crucibles. These results are shown in Table 1 collectively.

As shown in Table 1, regarding the quartz glass crucibles produced using, as raw material, the synthetic silica powder modified by the modification process of the present invention (Example: No. A1 to A4), the bubble content ratios were remarkably lower, and excellent dislocation free ratios were obtained. By the way, regarding examples using the treatment in the helium atmosphere of the present invention (No. A1 to A4), all of the bubble content ratios at the bottom part of the quartz crucible were less than 0.1% before use and less than 5% after use. Moreover, all of the bubble content ratios at the side wall part were less than 0.3% before use and less than 10% after use. On the other hand, regarding the quartz glass crucibles produced by the quartz powders of Comparison Examples, which were not treated in accordance with the present invention (No. B1 to B6), the bubble content ratios became partially about from 10 to 50 times of the bubble content ratios of the present invention, and the dislocation free ratios were less than a half of the present invention. Regarding Comparison Example B1, since the temperature of the inside of the furnace was too high, the silica powder, which was the raw material, was sintered. Regarding Comparison Example B2, since the temperature of the inside of the furnace at the time of opening to air after the helium treatment was more than 400° C., the bubble content ratio of the quartz crucible was high. Regarding Comparison Example B3, the dew point of helium was high. Moreover, regarding Comparison Example B4, since the highest temperature inside of the furnace was 600° C., helium was hardly adsorbed to the silica powder when it was introduced, so that the state of the silica powder did not change after the heating in vacuum. Therefore, even when the temperature at the time of opening to air was 400° C., the gas components of air were adsorbed on the silica powder. As a result, the bubble content ratio of the quartz crucible was high. Regarding Comparison Example B5 using nitrogen instead of helium, the bubble content ratio of the quartz crucible was almost same value as Comparison Example 6 made with non-treated quartz powder, and there were no effect of reducing bubbles.

The disclosure of the priority document, Japanese Application No. 2001-358746, filed in Japan on Nov. 26, 2001, is incorporated by reference herein in its entirety.

TABLE 1

|  | Example | | | | Comparison Example | | | | | |
| --- | --- | --- | --- | --- | --- | --- | --- | --- | --- | --- |
|  | A1 | A2 | A3 | A4 | B1 | B2 | B3 | B4 | B5 | B6 |
| Heating Modification process in Vacuum | | | | | | | | | | |
| Heating Temperature (° C.) | 1300 | 1200 | 800 | 1300 | 1450 | 1200 | 1200 | 1200 | 1200 | No-treatment |
| Heating Time (hr) | 24 | 24 | 24 | 2 | 8 | 24 | 24 | 24 | 24 | |
| Vacuum Pressure (Pa) | 0.8 | 1.1 | 3.3 | 4.7 | 24.3 | 1.1 | 1 | 1 | 1 | |
| Helium Atmosphere | | | | | | | | | Nitrogen | |
| Highest Temperature (° C.) | 1300 | 1200 | 700 | 1300 | 1450 | 1200 | 1200 | 600 | 1200 | |
| Dew point of He (° C.) | −80 | −80 | −50 | −50 | −80 | −80 | −40 | −80 | −80 | |
| Material Opening Temperature (° C.) | 400 | 400 | 400 | 400 | 400 | 450 | 400 | 400 | 400 | |
| Silica Powder after Treatment | | | | | | | | | | |
| Residual Carbon Concentration | 0.2 | 0.5 | 1.6 | 1.8 | — | 0.5 | 0.4 | 0.4 | 0.4 | 27.4 |
| Residual Hydroxyl group Concentration | 17 | 28 | 48 | 47 | — | 28 | 28 | 28 | 28 | 76 |
| Quartz Crucible Bottom Part | | | | | | | | | | |
| Bubble content ratio before use | 0.01 | 0.03 | 0.08 | 0.09 | Most silica powder was | 0.13 | 0.17 | 0.16 | 0.31 | 0.28 |
| Bubble content ratio after use | 0.3 | 0.9 | 2.8 | 3.1 | | 5.3 | 8.7 | 7.7 | 20 | 25.2 |

TABLE 1-continued

|  | Example | | | | Comparison Example | | | | | |
| --- | --- | --- | --- | --- | --- | --- | --- | --- | --- | --- |
|  | A1 | A2 | A3 | A4 | B1 | B2 | B3 | B4 | B5 | B6 |
| Side part |  |  |  |  | sintered during vacuum baking |  |  |  |  |  |
| Bubble content ratio before use | 0.03 | 0.1 | 0.21 | 0.28 | — | 0.33 | 0.5 | 0.47 | 0.4 | 0.44 |
| Bubble content ratio after use | 1.1 | 3.1 | 6.7 | 8 | — | 11.6 | 24.1 | 20.9 | 28 | 40.3 |
| Dislocation free ratio | 80 | 78 | 78 | 72 | — | 48 | 45 | 43 | 30 | 20 |
| Evaluation | ⊚ | ⊚ | ○ | ○ | x | x | x | x | x | x |

(Notice)
Bubble Content Ratio is the value of 0.5 mm from the inside surface. Regarding Evaluation,
⊚ is the best,
○ is better,
x is bad.
Dislocation free ratio (%) = (the weight of single crystal/the weight of raw material polycrystalline Si) × 100.
Units of Bubble content ratio is %. Units of Residual Carbon Concentration and Residual Hydroxyl group Concentration are ppm.

What is claimed is:

1. A process for modifying a synthetic silica powder, the process comprising:

placing in a vacuum vessel a synthetic silica powder produced by a sol-gel process from a metal alkoxide precursor, wherein the synthetic silica powder comprises gases adsorbed on the powder and has residual carbon and residual hydroxyl groups therein;

heating the synthetic silica powder in the vacuum vessel in a range of from a degas temperature of the synthetic silica powder to a temperature below the sintering temperature of the synthetic silica powder while evacuating the vacuum vessel to a pressure of 5 Pa or less, wherein the adsorbed gases are removed from the synthetic silica powder, without sintering the synthetic silica powder, so as to reduce residual carbon in the synthetic silica powder to less than 2 ppm and residual hydroxyl groups in the synthetic silica powder to less than 50 ppm;

introducing into the vacuum vessel an atmosphere consisting of helium after removing the adsorbed gases from the synthetic silica powder, wherein the helium is introduced into the vacuum vessel while the synthetic silica powder is still at a temperature of 700° C. or more, such that helium is fully adsorbed on the synthetic silica powder; and, cooling the synthetic silica powder in the atmosphere consisting of helium to a temperature of 400° C. or less to form a modified synthetic silica powder, wherein the degas temperature is about 700° C. or more, and the sintering temperature is 1400° C. or more.

2. The process according to claim 1, wherein the heating temperature is in a range of from 800° C. to 1200° C.

3. The process according to claim 1, wherein the helium introduced into the vacuum vessel has a dew point of −50° C. or less.

4. The process according to claim 1, wherein the vacuum vessel is a vacuum furnace.

5. A process for modifying a synthetic silica powder, the process comprising providing an amorphous synthetic silica powder produced by a sol-gel process from a metal alkoxide precursor, wherein the synthetic silica powder comprises gases adsorbed on the powder and has residual carbon and residual hydroxyl groups therein;

heating the synthetic silica powder in a vacuum furnace to a heating temperature in a range of from 700° C. to 1400° C. but less than a sintering temperature thereof;

maintaining the synthetic silica powder in the vacuum furnace in the range of from 700° C. to 1400° C. but less than the sintering temperature, while evacuating the vacuum furnace to a pressure of 5 Pa or less, so as to reduce residual carbon in the synthetic silica powder to less than 2 ppm and residual hydroxyl groups in the synthetic silica powder to less than 50 ppm;

introducing into the vacuum furnace helium having a dew point of −50° C. or less after reducing the residual carbon and the residual hydroxyl groups in the synthetic silica powder;

cooling the synthetic silica powder in the helium in the vacuum furnace to 400° C. or less to form a modified synthetic silica powder; and bringing the modified synthetic silica powder out of the vacuum furnace into air.

6. The process according to claim 5, wherein the heating temperature is in a range of from 800° C. to 1200° C.

* * * * *